United States Patent [19]

White et al.

[11] 4,047,196

[45] Sept. 6, 1977

[54] HIGH VOLTAGE SEMICONDUCTOR DEVICE HAVING A NOVEL EDGE CONTOUR

[75] Inventors: Joseph Paul White, Somerville; Peter Joseph Kannam, Princeton, both of N.J.

[73] Assignee: RCA Corporation, New York, N.Y.

[21] Appl. No.: 717,335

[22] Filed: Aug. 24, 1976

[51] Int. Cl.² ............... H01L 29/06; H01L 29/34; H01L 23/30

[52] U.S. Cl. ............................. 357/55; 357/52; 357/56; 357/73

[58] Field of Search ............... 357/52, 55, 56, 73

[56] References Cited

U.S. PATENT DOCUMENTS

| 3,241,010 | 3/1966 | Eddleston | 357/73 |
|---|---|---|---|
| 3,320,496 | 5/1967 | Topas | 357/56 |
| 3,535,774 | 10/1970 | Baker | 357/52 |
| 3,553,539 | 1/1971 | Nakashima | 357/52 |
| 3,586,549 | 6/1971 | Gray | 357/52 |
| 3,755,720 | 8/1973 | Kern | 357/73 |
| 3,972,113 | 8/1976 | Nakata et al. | 357/56 |
| 4,000,507 | 12/1976 | Nishida et al. | 357/52 |

*Primary Examiner*—Andrew J. James
*Attorney, Agent, or Firm*—H. Christoffersen; R. P. Williams; R. A. Hays

[57] ABSTRACT

A high voltage semiconductor device structure comprises a novel edge contour which directly contributes to increased voltage handling capability. Such a structure may further comprise a collector region shaped in coordination with the edge contour to provide a device having higher voltage capability.

11 Claims, 4 Drawing Figures

HIGH VOLTAGE SEMICONDUCTOR DEVICE HAVING A NOVEL EDGE CONTOUR

The present invention generally relates to semiconductor devices and, in particular, relates to high voltage devices.

High voltage devices, particularly those which are fast switching and capable of handling high currents as well, are in considerable demand. The prior art devices, such as transistor devices, have a major difficulty in achieving a high breakdown voltage, i.e., a base-collector PN junction breakdown voltage above about 1500 volts, while maintaining a high current capability, i.e., greater than about 5 amperes, without sacrificing a fast switching speed.

It is known in the art that the base-collector PN junction voltage is sustained by a depletion region when that junction is reverse biased. In order to increase the sustainable voltage thereacross the regions adjacent the PN junction are usually made thicker. It is also known that the current handling capability of such power transistors is determined primarily by the base-collector structure, i.e., the resistivity and widths thereof, the emitter geometry and other techniques such as current distribution techniques. Since the resistivity and width of the base region and the collector region is important to the current handling capability of the device, any change thereof to increase the voltage capability of the PN junction usually results in a reduction of the current handling capability of that device.

The present novel structure allows the widths and resistivities of the base and collector regions to be designed to optimize the current handling capability of the device, while the voltage capability is determined by structural portions of the device which are substantially independent of the widths and resistivities of the base and collector regions.

Figure 1:
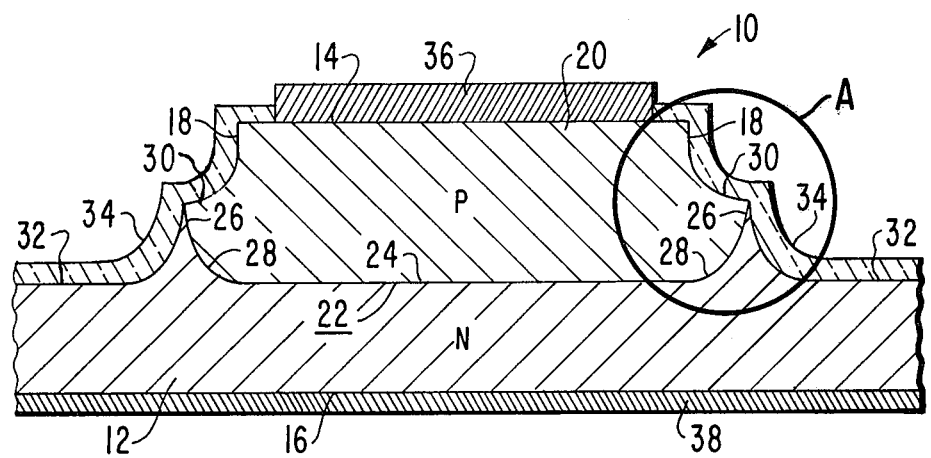
FIG. 1 is a partial cross-sectional view of one embodiment of the present device, not drawn to scale.

One embodiment of the present device, indicated generally at 10 in FIG. 1, comprises a body 12 of semiconductor material having first and second major opposing surfaces, 14 and 16 respectively. The body 12 further comprises a peripheral edge 18 extending between the major surfaces, a portion of which is contoured as particularly described below. While the material of the body 12 can be any semiconductor material, silicon is preferred. The body 12 has initially a one type conductivity, for example N type, although P type material may also be used so long as all other conductivities are likewise changed.

A first region 20 having a second type conductivity, P type in this embodiment, is adjacent the first surface 14 and extends into the body 12. The first region 20 forms a first PN junction 22 with the remainder of the body 12 at the interface therewith.

The first PN junction 22 comprises a bottom segment 24, an edge segment 26 and a radius segment 28. The bottom segment 24 is substantially parallel with the first surface 14. The edge segment 26 is substantially perpendicular to the first surface 14 and encloses the volume of the first region 20. The radius segment 28 connects the bottom segment 24 of the edge segment 26.

Figure 2:
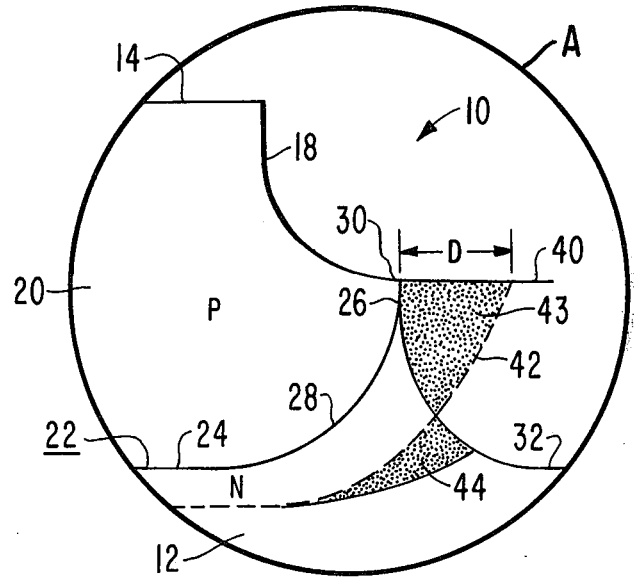
FIG. 2 is an enlarged view of a portion A of the device shown in FIG. 1.

The contoured portion, shown in the enlarged view of FIG. 2, of the peripheral edge 18 of the body 12 begins in the first region 20 and extends toward the second surface 16 to a first terrace 30. The first terrace 30, being substantially parallel with the first surface 14, intersects the edge segment 26 of the first PN junction 22. From a point near the intersection between the first terrace 30 and the edge segment 26, the contour extends toward the second surface 16 to a second terrace 32. The second terrace 32, being substantially parallel with the first surface 14, extends in a direction away from the edge segment 26. For reasons discussed below, it is preferred that the second terrace 32 be substantially coplanar with the bottom segment 24 of the first PN junction 22. Preferably, as also discussed below, the shape of the contour between the first surface 14 and the first terrace 30 and between the first and second terraces 30 and 32 respectively, is interior to straight lines drawn therebetween, that is, the shape is concave with respect to such lines.

A layer 34 of passivating material, such as a frit glass, a high resistivity polycrystalline silicon, or the like, covers the contoured portion of the edge 18. The edge segment 26 of the first PN junction 22 which terminates at about the extreme extent of the first terrace 30 is passivated by the layer 34 in a planar fashion, as discussed below.

First and second electrode means, 36 and 38 respectively, electrically contact the first region 20 and the second major surface 16 respectively.

The device 10 can be fabricated using procedures and techniques known in the semiconductor art. For example the contoured portion of the edge 18 may be formed by known etching or mechanical grinding techniques. The region 20 may be formed by known diffusion and/or ion implantation techniques.

A planar PN junction, as known in the art today, is one which terminates in a substantially perpendicular manner at a major surface of a semiconductor wafer. The primary advantage of such a PN junction is that by terminating in the above-stated fashion it is more easily passivated than, for example, a mesa PN junction which terminates at the peripheral edge of a wafer. Passivation of a PN junction's surface termination is extremely important in the fabrication of high voltage devices. This importance is warranted because any PN junction terminating at a wafer surface is subject to contamination from the ambient material. More importantly the PN junction termination is subject to high surface leakage currents resulting from crystal imperfections, or defects, which are most likely to occur at the PN junction/surface intercept.

Planar PN junctions have a major drawback known as the radius effect. The radius effect is the name given to the phenomenon of the electric-field intensity along a PN junction being greatest along the radial segment of a planar PN junction. Because of this effect voltage breakdown occurs at that portion of the PN junction rather than substantially uniformly along the bottom segment of such a PN junction. Voltage breakdown due to the radius effect occurs at a substantially lower voltage than voltage breakdown along the bottom segment. Since the high electric field intensity can cause high current densities at the breakdown point of the radius segment of the planar PN juntion, the device is likely to be damaged or destroyed because of the radius effect. The potential for damage or destruction is substantially reduced if the voltage breakdown occurs in the bulk of the semiconductor material because, in that instance, the breakdown is distributed over substantially the whole bottom segment and high current densities are thereby reduced.

When any PN junction is reverse biased a depletion region is formed in the material on both sides thereof. As the name indicates a depletion region contains very few, if any, free charge carriers, e.g., electrons. This lack of free charge carriers results because the free charge carriers are, upon the application of a reverse bias voltage, repelled from the metallurigical junction. Thus a depletion region is a region of very high resistivity. Since free carriers are repelled from the metallurgical PN junction an electric field is created and sustained thereacross. The electric field strength at any given point of the metallurgical PN junction is related to the applied voltage divided by the distance between the edges of the depletion region. Hence, for a given voltage, the shorter the depleted distance the greater the electric field strength and thus the greater the possibility of junction breakdown at that point. It is thus determined that the further a depletion region extends into the surrounding material the greater is the voltage sustainable across the PN junction. The distance that a depletion region extends is determined primarily upon the initial resistivities of the materials adjacent the PN junction. That is, a PN junction depletion region extends a greater distance into a comparatively higher resistivity material than into a comparatively lower resistivity material for a given voltage. Further, for a given voltage across a PN junction the total charge repelled on each side of the PN junction not only must be the same, i.e., charge equality must be maintained but also the total charge repelled is a fixed quantity. Hence if a number of free charge carriers to be repelled are not available near the junction, as in comparatively higher resistivity material, the depletion region extends from the junction until the necessary number of charge carriers are repelled. Because the surface termination is the weakest point of any PN junction, as discussed above, it is highly desirable to extend, or spread, the depletion region a greater distance along the surface than in the bulk of the semiconductor material. Prior art device structures have been primarily concerned with increasing the depletion region spread on only one side of the PN junction at its surface termination, see for example U.S. Pat. No. 3,320,496, issued to Topas. The present edge contour effectively spreads the depletion region on both sides of the PN junction and hence results in forcing any eventual voltage breakdown to occur in the bulk material. Thus a device having the present structure has a near ideal voltage breakdown value.

For purposes of explaining the operation of the device 10, an extended first terrace plane 40 and a virtual depletion region edge 42, are shown in FIG. 2. For clarity the conventional cross hatching has been omitted from FIG. 2. But for the contour and the presence of the second terrace the depletion region would contain the first area 43, which is stipeled for distinction. In that instance, the depletion region would only extend on the surface a distance D as shown in FIG. 2. However, since the first area 43 is not actually present, the free charge carriers displaced by the depletion region must be repelled from somewhere else, such as a second area 44, also stipeled, in order to maintain charge equality, as discussed above. Thus, the surface intercepts of the depletion region of the device 10 are further apart than on conventional devices for any given voltage. The greater separation results in a reduced electric field strength thereacross. The present edge contour therefore reduces the probability of surface voltage breakdown. Hence, for a rectifier type device 10 of the one embodiment, when a reverse bias voltage is applied across the first and second electrode means, 36 and 38 respectively, the PN junction 22 sustains a comparatively higher voltage than a conventional device without the present edge contour. Furthermore the breakdown voltage capability of the present device 10 is enhanced because of the planar type passivation. Such planar type passivation is achievable because the first terrace 30 intersects the edge segment 26 of the PN junction 22 in a substantially perpendicular fashion.

Because of the present edge contour of the device 10, which is operationally a semiconductor rectifier, the reverse bias voltage breakdown is believed to be controlled by the radius effect rather than the ideal bulk breakdown characteristics of the semiconductor material of the body 12. This is most probable if a region of N type material having a comparatively higher conductivity carrier concentration than the material of the body 12 is adjacent the second major surface 16. Such a region, not shown in FIG. 1 or 2, is usually present to provide a second surface 16 which is conducive to a low resistance contact with the second electrode 38.

Figure 3:
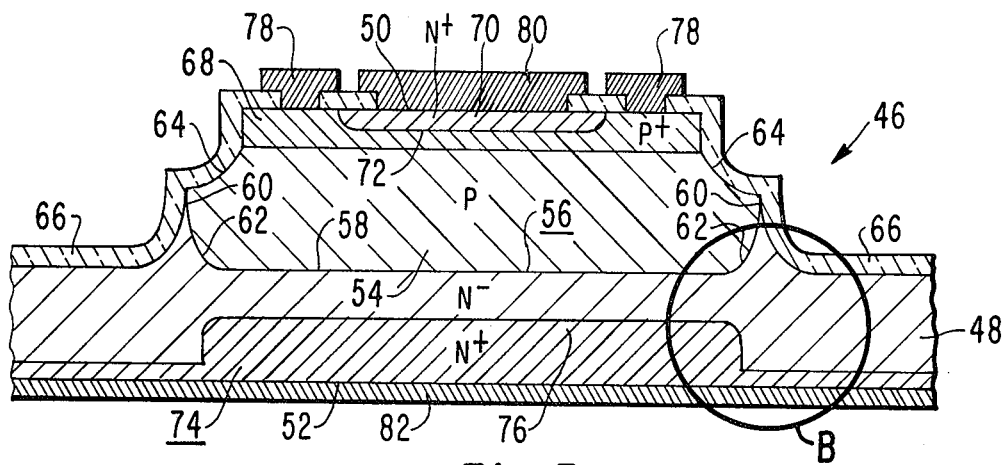
FIG. 3 is a partial cross-sectional view of another embodiment of the present device structure, not drawn to scale.

Other regions of different conductivity types may be introduced into the body 12 having the novel edge contour to form other devices, such as a transistor. One such device, indicated generally at 46, is shown in FIG. 3.

The device 46 comprises a body 48 initially having N type conductivity and having first and second major opposing surfaces 50 and 52, respectively.

A first region 54 having P type conductivity is within the upper portion of the body 48. The first region 54 forms a first PN junction 56 with the material of the body 48 at the interface therewith. The first PN junction 56, like the first PN junction 22 of the device 10, has a bottom segment 58, an edge segment 60 and a radius segment 62.

The body 48 has an edge 64 having a portion which has a contour the same as that of the above discussed device 10. The edge 64 has a layer 66 of passivating material thereon.

The device 46 as described to this point is substantially identical to the device 10.

The device 46 further comprises a second region 68 having p+ type conductivity within the first region 54 and adjacent the first major surface 50. The surface conductivity carrier concentration of the second region 68 is preferably greater than that of the first region 54. The first and second region, 54 and 68 respectively, together can be considered a base region of a transistor.

At least one third region 70 having N+ type conductivity is within the second region 68 and adjacent the first surface 50. That is, there can be a plurality of third regions 70 within the second region 68. The third region 70 forms a second PN junction 72 with the second region 68 at the interface therewith. The third region 70 can constitute an emitter region of a transistor.

A fourth region 74 having N+ type conductivity is adjacent the second surface 52 and extends into the N− type body 48. Preferably the fourth region 74 has a higher carrier concentration than the material of the body 48. The N⁻ type material of the body 48 and the fourth region 74 can together constitute a collector region of a transistor.

Preferably, for reasons discussed below, a portion 76 of the fourth region 74 which is substantially vertically aligned with the third region 70, extends further into the body 48 than the remainder of the fourth region 74.

First, second and third electrode means, 78, 80 and 82 respectively, contact the second region 68, the third region 70 and the fourth region 76 respectively.

The conductivities and depths of the various regions can be determined by using techniques known for the fabrication of high current and fast switching devices. For example, in the present embodiment, the third, or emitter, region 70 has a surface carrier concentration on the order of about $10^{20}$ atoms/cm$^3$ and a depth which is about 25% of the total depth, measured from the first surface 50, of the first region 54. The depth of the first region 54 is on the order of about 2 mils (about 50 micrometers). The second region 68 has a surface carrier concentration on the order of about $10^{18}$ atoms/cm$^3$ and extends into the first region 54 about 0.6 mils (about 15 micrometers). The first region 54 in the present embodiment when made by diffusion techniques has a surface carrier concentration on the order of about $10^{15}$ atoms/cm$^3$. The material of the body 48 initially has an average carrier concentration on the order of about $10^{14}$ atoms/cm$^3$ and, after the formation of the first region 54 the amount of material having that carrier construction is about 3 mils (about 75 micrometers) thick. The portion 76 of the fourth region 74 extending into the body 48 from the second surface 52 thereof is about 2 mils (about 50 micrometers) thick and preferably has a surface carrier concentration on the order of about 5 × $10^{16}$ atoms/cm$^3$.

As discussed above, second to the surface intercept the curved, or radius, segment 58 of the first PN junction 56 is the most susceptible to destructive voltage breakdown. Ideally, if a PN junction breaks down in the bulk of the semiconductor material the breakdown current is spread over a large area of the PN junction and thus the current at any given point is less dense and there is little or no damage to the device. However, when breakdown, due to the radius effect, takes place, the current is concentrated at the point of breakdown and often causes catastrophic damage to the device because of the high temperatures associated with high current densities.

Figure 4:
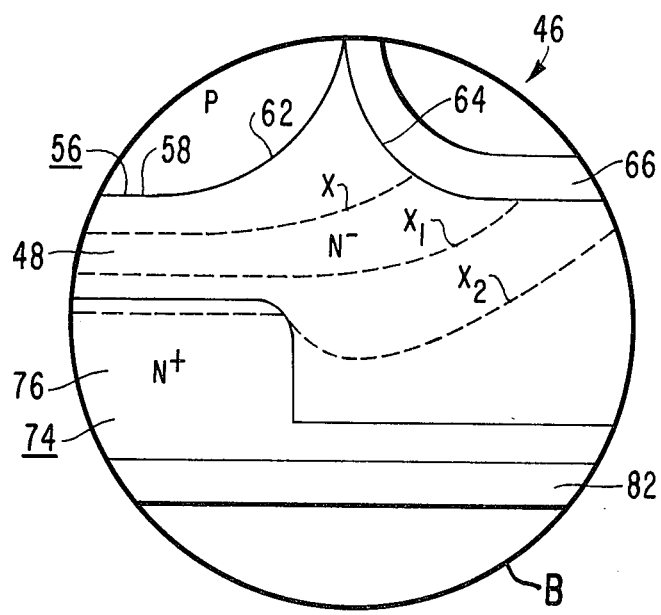
FIG. 4 is an enlarged view of a portion B of the device shown in FIG. 3.

In the device 46 the structure of the fourth region 74 in combination with the novel edge contour, discussed above, substantially completely insures that any voltage breakdown of the first PN junction 50 takes place at or near the ideal bulk breakdown voltage. The structure further insures that such a breakdown, if it occurs, takes place along the bottom segment 58 of the first PN junction 56. A series of equipotential electric field lines, X, $X_1$, and $X_2$ are illustrated in the enlarged FIG. 4. The lines represent the boundaries of the depletion regions associated with the first PN junction 56 at increasing reverse bias voltages i.e., $X_1$ represents the extent of the depletion region at a reverse bias voltage greater than that represented by the line X. Likewise $X_2$ represents a reverse bias voltage greater than that represented by $X_1$. Since only the portion of the depletion region extending toward the collector region from the first PN junction 56 is pertinent to the following discussion the remainder of the depletion region is not shown.

As shown by the line X the shape of the depletion region, while being spread along the edge 64, due to the edge contour, substantially maintains the curve-like shape of the radius segment 62. The line $X_1$ depicts a radius of curvature portion of the depletion region which, due to the edge spreading, it comparatively less distinct than that shown by line X but which is nonetheless still present.

The line $X_2$ shows the effect when the depletion region of the present structure reaches the fourth region 74. The line $X_2$ extends a comparatively shorter distance into the extended portion 76, than it extends into the surrounding material of the body 48. If the fourth region 74 extended into the body 48 in a substantially plane manner, i.e., the extended portion 76 not being present, the expansion of the bottom segment of the line $X_2$ thereinto would be substantially equal therealong. However, as shown, the portion of the line $X_2$ which is an extension from the radius segment 62 of the first PN junction 56 extends a greater distance from the metallurgical junction 56 than the extension of the bottom segment 58 thereof. Thus, as discussed above, the electric field strength is comparatively reduced along the radius segment 62 with respect to the electric field strength along the bottom segment 58. Expansion of the depletion region with further increases of reverse bias voltage continues until PN junction breakdown, which, for the particular device described above, takes place along the bottom segment 58, i.e., in the bulk.

The present edge contour, particularly in conjunction with the above-described structure of the fourth region 74, permits the voltage breakdown characteristics of a transistor to be maximized substantially independently of the current carrying and switching characteristics thereof. The carrier concentrations and depths of the internal regions of such a device can therefore be designed primarily to maximize the current carrying capability and switching speed of the device. For example, a transistor having a voltage breakdown rating of about 1500 volts, a current carrying capability of about 5 amperes with a turn-off fall time on the order of about 1 microsecond can be easily fabricated. Such a device, because of these characteristics, is extremely useful for example, as a horizontal deflection transistor in a television receiver.

What is claimed is:

1. A semiconductor device comprising:
    a body of semiconductor material having first and second major opposing surfaces and a peripheral edge extending therebetween, said body initially having a one type conductivity;
    a first region having a second type conductivity extending within said body, said first region forming a first PN junction with said body at the interface therewith, said junction comprising an edge segment extending substantially perpendicular to said first surface, a bottom segment extending substantially parallel with said first surface and a radius segment connecting said edge segment and said bottom segment;
    a contoured portion of said edge, said contour beginning at said first surface in said region and extending toward said second surface to a first terrace, said first terrace intersecting said edge segment of said first PN junction, said contour, from a point near said intersection, further extending toward said second surface to a second terrace, said contour being concave between said intersection and said second terrace.

2. A semiconductor device as claimed in claim 1 wherein:
said first and said second terraces are substantially parallel to said first surface.

3. A semiconductor device as claimed in claim 1 wherein:
said second terrace is substantially coplanar with said bottom segment.

4. A semiconductor device as claimed in claim 1 further comprising:
a layer of passivating material on said contoured portion.

5. A semiconductor device as claimed in claim 1 wherein:
said first terrace intersects said edge segment substantially perpendicularly.

6. A semiconductor device as claimed in claim 1 further comprising:
a second region within said first region having said second type conductivity, said second region being adjacent said first surface;
at least one third region within said second region having said one type conductivity, said third region being adjacent said first surface; and
a fourth region adjacent said second surface extending into said body and having said one type conductivity.

7. A semiconductor device as claimed in claim 6 wherein:
said second region has a comparatively higher surface carrier concentration than said first region.

8. A semiconductor device as claimed in claim 6 wherein:
said fourth region has a comparatively higher carrier concentration than said body.

9. A semiconductor device as claimed in claim 6 wherein:
said fourth region further comprises a portion extending comparatively further into said body than the remainder of said fourth region.

10. A semiconductor device as claimed in claim 9 wherein:
said extended portion is substantially vertically aligned with said third region.

11. A semiconductor device as claimed in claim 10 wherein:
said device is a transistor having said third region as an emitter region, said first and said second regions together being a base region and said fourth region and said body material being a collector region.

* * * * *

UNITED STATES PATENT OFFICE
CERTIFICATE OF CORRECTION

Patent No. 4,047,196   Dated September 6, 1977

Inventor(s) Joseph Paul White et al.

It is certified that error appears in the above-identified patent and that said Letters Patent are hereby corrected as shown below:

Column 3, line 15, "metallurigical" should read -- metal-lurgical --.
Column 5, lines 30 and 31, "construction" should read -- concentration --.
Column 5, line 53, "50" should read -- 56 --.
Column 6, line 6, "it" should read -- is --.
Column 6, line 63, "first" has been omitted between "said" and "region".

Signed and Sealed this

Thirteenth Day of December 1977

[SEAL]

Attest:

RUTH C. MASON
Attesting Officer

LUTRELLE F. PARKER
Acting Commissioner of Patents and Trademarks